United States Patent [19]
Vella-Coleiro

[11] Patent Number: 4,825,174
[45] Date of Patent: Apr. 25, 1989

[54] SYMMETRIC INTEGRATED AMPLIFIER WITH CONTROLLED DC OFFSET VOLTAGE

[75] Inventor: George P. Vella-Coleiro, Summit, N.J.

[73] Assignee: American Telephone and Telegraph Company, AT&T Bell Laboratories, Murray Hill, N.J.

[21] Appl. No.: 209,462

[22] Filed: Jun. 20, 1988

[51] Int. Cl.[4] .............................................. H03F 3/16
[52] U.S. Cl. ................................... 330/277; 330/264
[58] Field of Search .................. 330/9, 253, 264, 277, 330/300, 311

[56] References Cited

U.S. PATENT DOCUMENTS

| | | | |
|---|---|---|---|
| 4,612,514 | 9/1986 | Shigaki et al. | 330/277 |
| 4,616,189 | 10/1986 | Pengue, Jr. | 330/253 |
| 4,634,993 | 1/1987 | Koen | 330/253 |
| 4,646,028 | 2/1987 | Palmer | 330/277 |
| 4,767,946 | 8/1988 | Taylor | 330/277 X |

OTHER PUBLICATIONS

InGaAs Monolithic Photoreceiver Integrating PIN/JFET with Diffused Junctions and a Resistor, J. C. Renaud, M. Allovon, C. Courbet, S. Vuye, A. Scavennec, Optical Fiber Communication Confr., 1988 Tech. Digest Series, vol. 1, Jan. 25–28, 1988.
Broad-Band Medium-Power Amplification in the 2–12.4-GHz Range with GaAs MESFET's, IEEE Transactions on Microwave Theory and Techniques, vol. MTT-24, No. 6, Jun. 1976, Derry P. Hornbuckle and Louis J. Kuhlman, Jr.
GaAs IC Direct-Coupled Amplifiers, Derry Hornbuckle, 1980 IEEE MTT-S International Microwave Symp. Digest, May 28–30, 1980.
Monolithic GaAs Direct-Coupled Amplifiers, Derry P. Hornbuckle, IEEE Transactions on Electron Devices, vol. ED-28, No. 2, Feb. 1981.

*Primary Examiner*—Steven Mottola
*Attorney, Agent, or Firm*—Wendy W. Koba

[57] ABSTRACT

A symmetric integrated FET amplifier is disclosed which exhibits a DC offset voltage that is insensitive to power supply variations, as well as variations in the threshold voltages of the FETs forming the amplifier. These variations are known to be most prevalent in InP-based FET amplifier arrangements. The symmetry is achieved by using a pair of impedance matching elements in the input stage of the amplifier to essentially match the impedance of the input FET and its load element, and a matching buffer FET and diode level shifting arrangement are used to match similar elements present in the output branch of the amplifier structure. The impedance matching elements, as well as the level shifting diodes, may all be formed with FET structures to minimize fabrication problems. In accordance with the symmetric arrangement of the present invention, the output DC offset voltage will be maintained at zero volts, regardless of the variations noted above. A multistage symmetric amplifier may then be formed simply by directly connecting a number of single stage symmetric amplifiers together in series.

16 Claims, 5 Drawing Sheets

SYMMETRIC INTEGRATED AMPLIFIER WITH CONTROLLED DC OFFSET VOLTAGE

BACKGROUND OF THE INVENTION

1. Field of the Invention

The present invention relates to a symmetric integrated amplifier with controlled DC offset voltage and, more particularly, to such an amplifier which is insensitive to variations in either the power supply voltages or transistor threshold voltage.

2. Description of the Prior Art

Optical communication systems currently under development are beginning to utilize opto-electronic integrated circuits (OEICs)as fully integrated lightwave transmitters, repeaters, receivers, etc. A clear advantage of such OEICs is their small size relative to the bulk devices in use today. A problem being currently addressed in the art is providing a substrate material, and corresponding fabrication techniques, which is compatible with both the optical and electronic components. Most electronic integrated circuits is use today are formed on a silicon substrate, where silicon is not a preferred substrate material for lightwave devices, including lasers, LEDs, or photodiodes. In contrast, the GaAs substrate material utilized in lightwave fabrication is suitable only for short wavelength (0.8–0.9 $\mu$m) communications, whereas long haul and/or high bit rate systems require wavelengths beyond the range of GaAs ($\approx$1.3–1.5 $\mu$m). A reasonable compromise has emerged where OEICs are formed on indium phosphide (InP) substrates, with lattice-matched GaInAsP material grown on the InP substrate for lightwave device formation. For a large variety of OEICs, some sort of electronic amplifier is required. Unlike silicon and GaAs, however, InP does not have a well-established field effect transistor (FET) technology. Due to gate-semiconductor interfacial problems, the metal-insulator-semiconductor (MIS) and metal-semiconductor (MES) FETs do not appear to be practical InP.

One recent attempt to fabricate an integrated photoreceiver on an InP substrate is discussed in the article "InGaAs Monolithic Photoreceiver Integrated PIN/JFET With Diffused Junctions and a Resistor" by J. C. Renaud appearing as paper WF3 in the *Optical Fiber Communication Technical Digest*, 1988. In particular, Renaud describes the formation of a PIN/JFET structure based on a three-layer InGaAs structure grown on a semi-insulating InP substrate. A problem remains with the JFET structure of this particular arrangement in that the DC offset voltage of the JFET may vary as a function of changes in the power supply. Further, similar JFETs included in separate photoreceivers may exhibit vastly different threshold voltages, due to the relatively complex InP-based JFET fabrication process. The latter problem creates a significant impediment to the formation of multi-stage amplifiers, since the output voltages from the cascaded stages will be unknown and thus uncontrollable.

Therefore, a need remains in the prior art for a transistor amplifier structure which is compatible with the advances in OEICs and may be configured in a cascaded form without suffering the problems described above.

SUMMARY OF THE INVENTION

The problem remaining in the prior art is addressed by the present invention which relates to a symmetric integrated amplifier with controlled voltage offset and, more particularly, to such an amplifier which is insensitive to variations in either the power supply voltages or transistor threshold voltages.

In accordance with the present invention, a symmetric JFET amplifier arrangement is disclosed which provides (in the quiescent state) an identical voltage drop between each power supply (VDD,VSS)and the amplifier output. This voltage drop is provided by a series of transistors and diodes inserted between each power supply and the output node. The number of diodes is a matter of design choice, where the diodes may be formed by gate-source connection of JFET devices.

As mentioned above, the threshold voltage of InP-based JFET devices may vary by several volts, as a result of variations in the fabrication process. Thus, the DC offset voltage of conventional JFET amplifiers formed in InP may also vary. This variation in DC offset voltage makes the formation of any type of multi-stage amplifier impossible. An advantage of the symmetric arrangement of the present invention is that virtually no DC offset voltage is present if the portion of the circuit connected between VDD and the output is identical to the portion of the circuit between VSS and this same output node. Thus, a multi-stage amplifier may be formed when utilizing the symmetric arrangement of the present invention merely by directly coupling single stage amplifiers together in series. Direct coupling, as will be discussed below, is preferred over capacitive coupling in that it does not affect the bandwidth of the multistage amplifier.

Other and further advantages of the present invention will become apparent during the course of the following discussion and by reference to the accompanying drawings.

BRIEF DESCRIPTION OF THE DRAWING

Referring now to the drawings.

DETAILED DESCRIPTION

Figure 1:
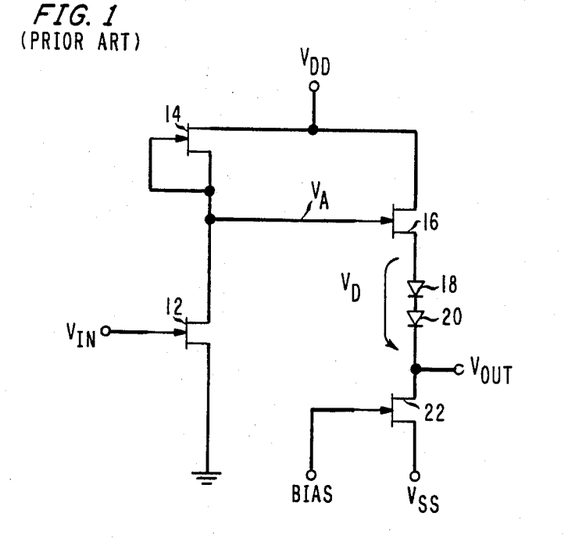
FIG. 1 illustrates a conventional prior art JFET (or MESFET) amplifier arrangement.

Referring now to FIG. 1, a conventional prior art FET amplifier 10, useful for OEIC applications, is shown. This particular arrangement, as described by D. P. Hornbuckle et al. in a paper entitled "Monolithic GaAs Direct-Coupled Amplifiers" appearing in *IEEE Transactions on Electron Devices*, Vol. ED-28, No. 2, Feb. 1981 at pp. 175–182, was originally conceived for use in a multistage configuration and may provide large bandwidths with high gain when used in this form. Amplifier 10 includes a first FET 12 to which an input voltage signal $V_{IN}$ is applied. An active load, consisting of a gate-source coupled second FET 14 is connected between the drain of FET 12 and a first power supply, denoted VDD. An active load is considered to be superior to a common resistor load between drain and power supply in that the active load provides for improved large-signal performance. In combination, this arrangement will amplify and invert the applied voltage $V_{IN}$. The portion of the circuit described to this point could be cascaded, with appropriate capacitive coupling, to form a multistage amplifier, where the gain of the multistage arrangement would be a multiplicative increase over the gain of this single stage. However, the bandwidth of such an arrangement would be significantly reduced for two reasons: (1) the capacitor between stages will limit the low frequency response, and (2) the high frequency response will be limited by the high output impedance of the inverter circuit. Such capacitive coupling is required to eliminate the DC offset voltage of the amplified signal introduced by FETs 12 and 14.

This capacitive loading is thus significantly reduced in amplifier 10 of FIG. 1 by applying the inverted $V_{IN}$ appearing at the drain of transistor 12 to the gate of a third FET 16, referred to as a buffer FET. As shown in FIG. 1, the drain of buffer FET 16 is directly coupled to VDD. Connected between the source of buffer FET 16 and the output of amplifier 10 is a pair of level shifting diodes 18 and 20, where each diode will contribute an approximate voltage drop of 1V to the inverted $V_{IN}$ appearing at FET 16. To further simplify the fabrication of amplifier 10, diodes 18 and 20 may be formed as FETs, with their respective sources and drains connected. Thus, for a +2V DC voltage level at the gate of buffer FET 16, a voltage drop of −2V provided by diodes 18 and 20 will result in a 0V DC offset voltage at the output of amplifier 10, where this 0V DC voltage offset thus allows for direct coupling of the input of another amplifier stage to the output of amplifier 10. This arrangement, therefore, removes the need to provide capacitive coupling between stages and reduces the amplifier output impedance (since FET 16 is a source-follower), thereby resulting in increasing the bandwidth of the multistage arrangement as compared with those which require capacitive coupling. It is to be understood that the number of diodes utilized in such an arrangement is chosen to provide the desired DC voltage drop between buffer FET 16 and the output. In some circumstances, for example, it may be desirous to provide a negative DC bias to an output signal. In that case, a larger number of diodes may be connected in series.

As shown in FIG. 1, a fourth FET 22 is connected between the amplifier output and the second voltage supply, VSS. FET 22 is utilized as a current source between the amplifier output $V_{OUT}$ and a second power supply VSS. The current flowing through the output stage, and hence the DC voltage $V_{OUT}$, is determined by the bias voltage applied to the gate of FET 22.

Figure 2:
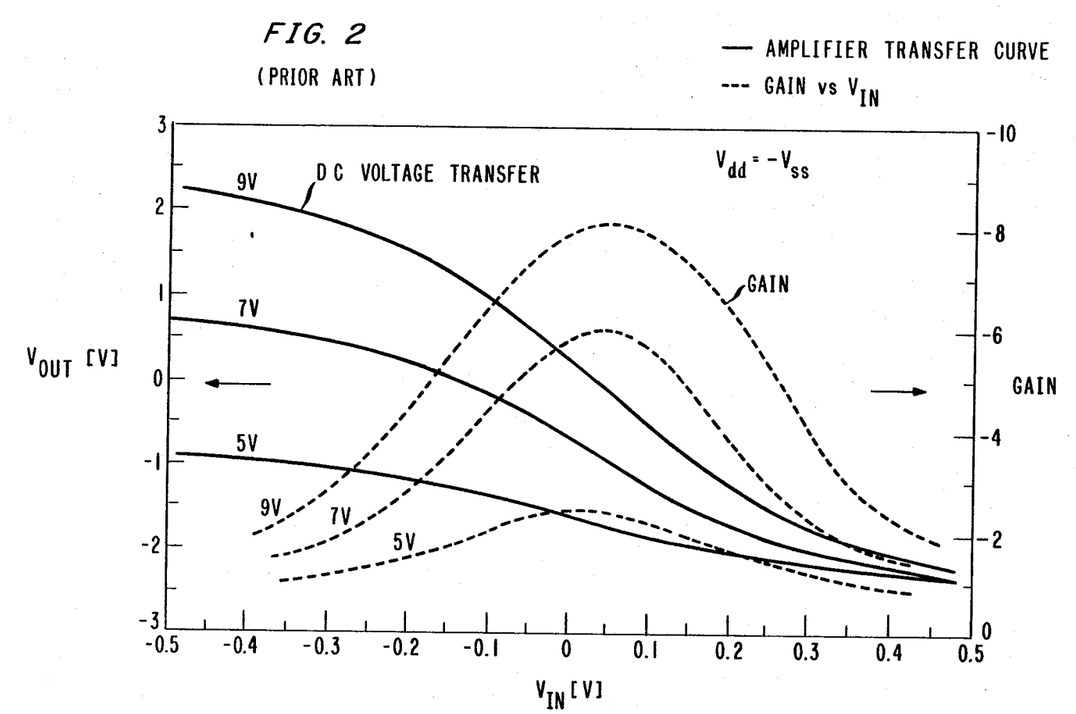
FIG. 2 is a graph illustrating the amplifier transfer curve and gain of the prior art JFET amplifier of FIG. 1.

The measured DC voltage transfer characteristic and calculated gain of amplifier 10 is shown in the graph of FIG. 2. Both the voltage transfer characteristic and gain are illustrated for a number of supply voltages (VDD = −VSS) so as to illustrate their variation with changes in the supply voltage. As indicated, the amplifier gain will increase as the supply voltage increases.

For the specific arrangement associated with FIG. 2, the gain increases from a value of 2 at VDD = −VSS = 5V to a maximum of 8 at VDD = −VSS = 9V. The DC transfer curves for these same supply voltage levels illustrate that a change in the DC offset voltage results as the power supply voltage changes. For example, with $V_{IN} = 0V$ (typical case where there is no DC bias associated with the input signal), the DC offset voltage ($V_{OUT}$) will vary from approximately −1.7V for a 5V supply voltage, to a value of approximately +0.5V for a 9V supply voltage, a change of over 2V for a DC input signal. When the input signal does have a DC bias, the variation becomes even greater, and may be well over 3V for a 5 to 9V change in power supply.

Figure 5:
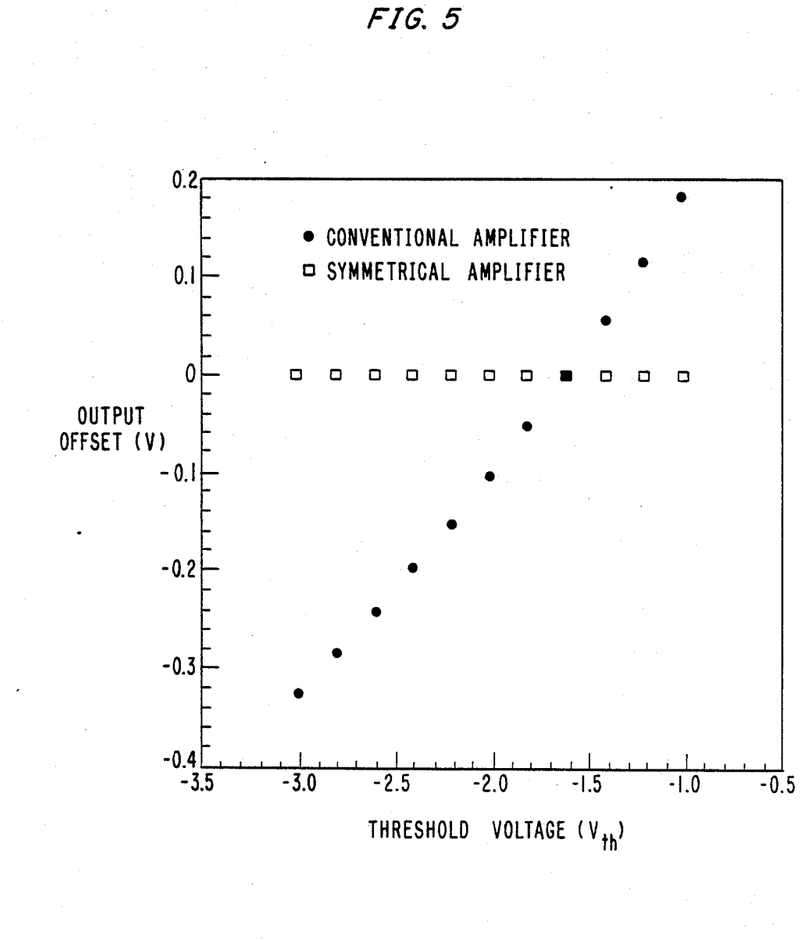
FIG. 5 is a graph of DC offset voltage as a function of JFET threshold voltage for both the prior art arrangement of FIG. 1 and the inventive symmetric arrangement of FIG. 3.

As will be discussed further below in association with FIG. 5, a DC voltage offset may also arise when the individual FET characteristics, most notably the threshold voltage, change for a fixed power supply. This DC offset voltage can be removed by either separately adjusting the power supply voltages (VSS,VDD), or by adjusting the bias to the gate of current source FET 22 which will, in turn, change the bias current for level shifting diodes 18 and 20. For most applications requiring DC coupling, neither of these alternatives is acceptable.

Figure 3:
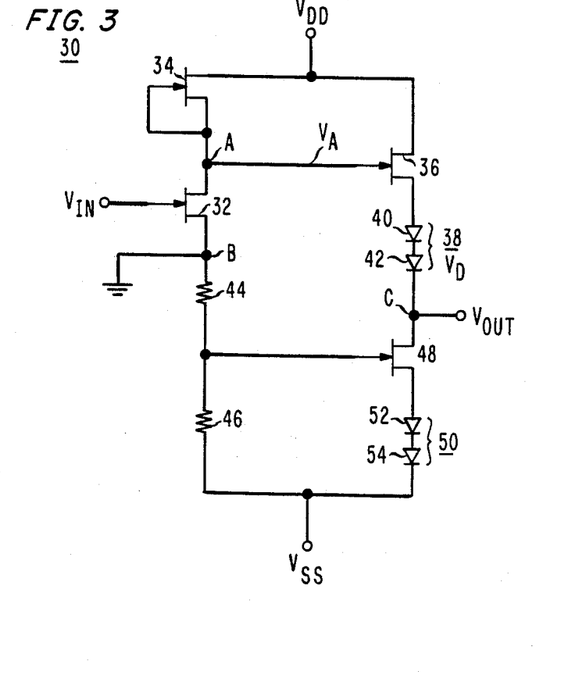
FIG. 3 illustrates an exemplary symmetric JFET (or MESFET) amplifier arrangement formed in accordance with the present invention.

A preferred solution to this problem is the symmetric amplifier configuration of the present invention, as illustrated in FIG. 3. Symmetric amplifier 30, like prior art amplifier 10 discussed above, utilizes a common source FET to provide the amplifier gain. In particular, an input voltage $V_{IN}$ is applied to the gate of a first FET 32. A second FET 34 is used as an active load between a first power supply VDD and the drain of FET 32, where the gate of load FET 34 is connected to its source and the drain of input FET 32. IT is to be noted that a conventional resistor load may alternatively be used between input FET 32 and VDD. AS with the prior art arrangement of FIG. 1, the signal appearing at node A (the drain of FET 32) will be an amplified and inverted version of input signal $V_{IN}$. This signal is then applied as the gate signal to a buffer FET 36, where the drain of buffer FET 36 is directly coupled to VDD. A diode level shifting arrangement 38 is connected between the source of buffer FET 36 and the output of amplifier 30. For the particular arrangement illustrated in FIG. 3, diode level shifting arrangement 38 is illustrated as comprising a pair of diodes 40 and 42. However, as discussed above in association with FIG. 1, such a level shifting arrangement may comprise any number of diodes required to provide the desired amount of DC voltage level shifting. Additionally, as previously discussed, these diodes may be formed with source-drain connected FETs to simplify the amplifier fabrication process.

Referring back to FIG. 3, the voltage at the gate of buffer FET 36 is illustrated as comprising a DC voltage bias of $V_A$. Diode level shifting arrangement 38 is illustrated as providing a voltage decrease of magnitude $V_D$ to voltage $V_A$ where $V_D = 2*V_{diode}$, $V_{diode}$ being defined as the voltage drop across en exemplary diode. In most instances, $V_{diode}$ will be approximately 1.0 volts. Since the output voltage is 0V as a result of the symmetric arrangement, the gate-to-source voltage $V_{gs}$ of FET 36 is $V_A - 2*V_{diode}$. For JFETs and MESFETs, it is desirable to prevent $V_{gs}$ from becoming more positive than approximately 0.5 V, so as to prevent substantial gate current flow.

In accordance with the teachings of the present invention, the problems associated with prior art amplifier 10 are eliminated by forming amplifier 30 as a symmetrical amplifier. In particular, the input branch of the amplifier including input FET 32 and active load FET 34 is balanced by a pair of resistive elements 44 and 46, where elements 44 and 46 are connected in series between ground or common node (labeled as node B) and a second power supply VSS. The specific values for elements 44 and 46 are not critical; their function is to provide a gate bias for an additional FET 48 (described below) which matches the gate bias of FET 36 (a value of $\approx$ 10K ohms is suitable). That is, the value of resistive element 44 is chosen to match the impedance of active load FET 34 and the value of resistive element 46 is chosen to match the impedance of input FET 32. Resistive elements 44,46 are illustrated in FIG. 3 as conventional resistors. However, active load elements, such as gate-source coupled FETs may be used in their place.

With the symmetry provided by elements 44 and 46, the voltage drop between VDD and node A will match (in magnitude) the voltage drop between node B and the gate of FET 48. The symmetry in amplifier 30 is completed by including FET 48 as a buffer FET (like FET 36) and a diode level shifting arrangement 50 between the output of amplifier 30 (labeled as node C) and power supply VSS. The symmetry will be maintained so long as buffer FET 48 matches buffer FET 36 and diode arrangement 50 matches diode arrangement 38. In this case, the voltage drop between VDD and node C will match (in magnitude) and track the voltage drop between VSS and node C.

Figure 4:
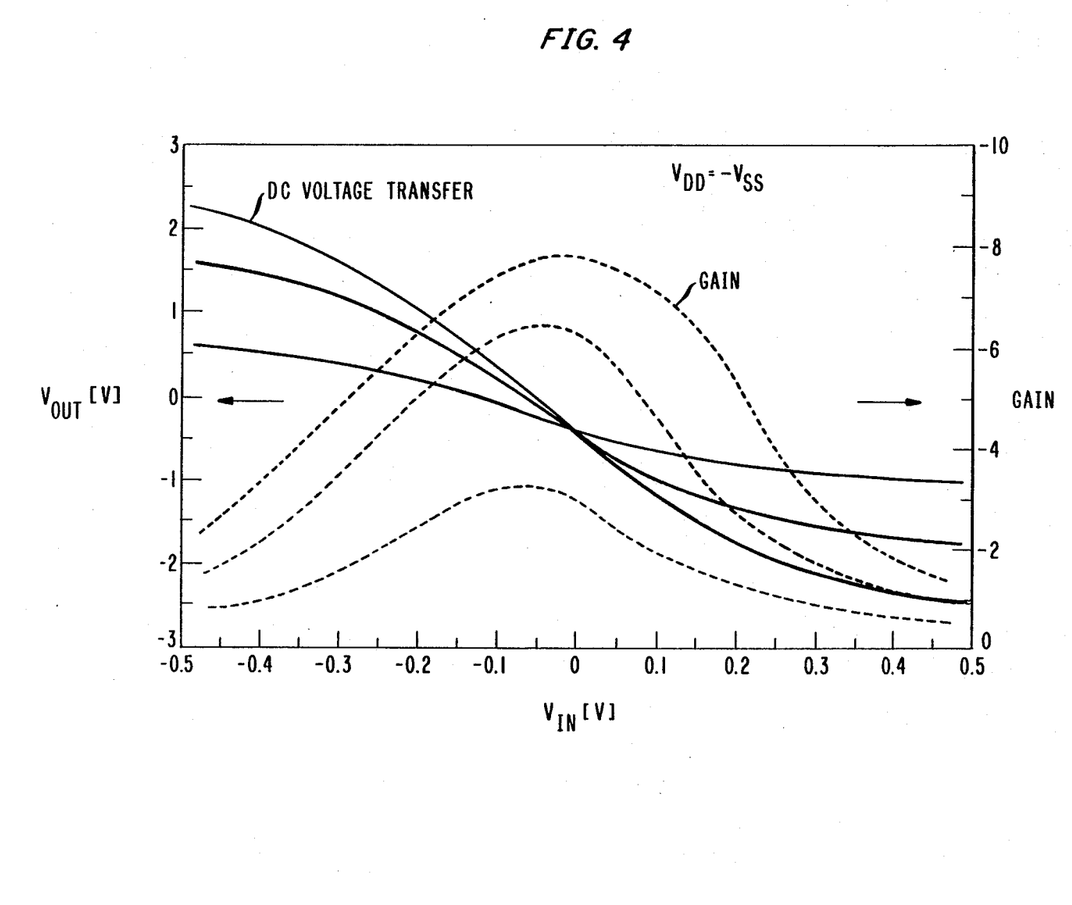
FIG. 4 is a graph illustrating the amplifier transfer curve and gain of the inventive symmetric amplifier arrangement of FIG. 3.

FIG. 4 illustrates the DC voltage transfer curves and gain for the arrangement of FIG. 3, applying the same power supply voltages as used to generate the curves of FIG. 2. In comparing FIGS. 2 and 4, it is seen that the gain curves for the two arrangements are substantially identical. However, the DC transfer voltage for amplifier 30 of the present invention is much improved over that of prior art amplifier 10. In particular, for the case where $V_{IN}$=0V (no DC bias on the input signal), the DC offset voltage will remain at 0V, regardless of changes in the power supply voltage from 5V through 9V. Note that for the symmetric amplifier arrangement of the present invention, the various transfer curves cross at $V_{IN}=V_{OUT}$=0V, instead of merging at the extreme negative DC offset voltage level, as shown in the curves of FIG. 2 associated with prior art amplifier 10.

Another advantage of the symmetrical arrangement of the present invention, as discussed above, is that it is insensitive to variations in the FET threshold voltage. This advantage is of particular relevance when fabricating InP-based FETs for use with OEICs, where as discussed above, the InP fabrication technology cannot at this point in time adequately control FET formation so as to accurately provide, from wafer to wafer, identical threshold voltages. FIG. 5 illustrates this advantage, where FIG. 5 is a graph of DC offset voltage as a function of FET threshold voltage (for a given VSS=VDD). This graph is a result of computer simulations of prior art amplifier 10 of FIG. 1 and symmetrical amplifier 30 of FIG. 3, utilizing the values associated with typical InP-based FETs. As seen by reference to FIG. 5, the DC output offset voltage of prior art amplifier 10 increases in a fairly linear fashion from a value of approximately −0.33V for a threshold voltage $V_{th}$ of −3.0V, to a value of +0.18V for a threshold voltage $V_{th}$ of approximately −1.0V. In contrast, the DC offset voltage of symmetric amplifier 30 remains at 0V, regardless of threshold voltage value.

As discussed above, an advantage of the amplifier configuration of the present invention is that a zero DC offset voltage is obtained by virtue of its symmetrical circuit arrangement. Therefore, a symmetric amplifier may be fabricated which exhibits a 0V DC offset, regardless of changes in supply voltage of transistor threshold voltage. With this ability to reproducibly provide a 0V DC offset, a multistage symmetric amplifier may be formed simply by connecting a number of single stage amplifiers together in series. One such multistage symmetric amplifier is illustrated in FIG. 6.

Figure 6:
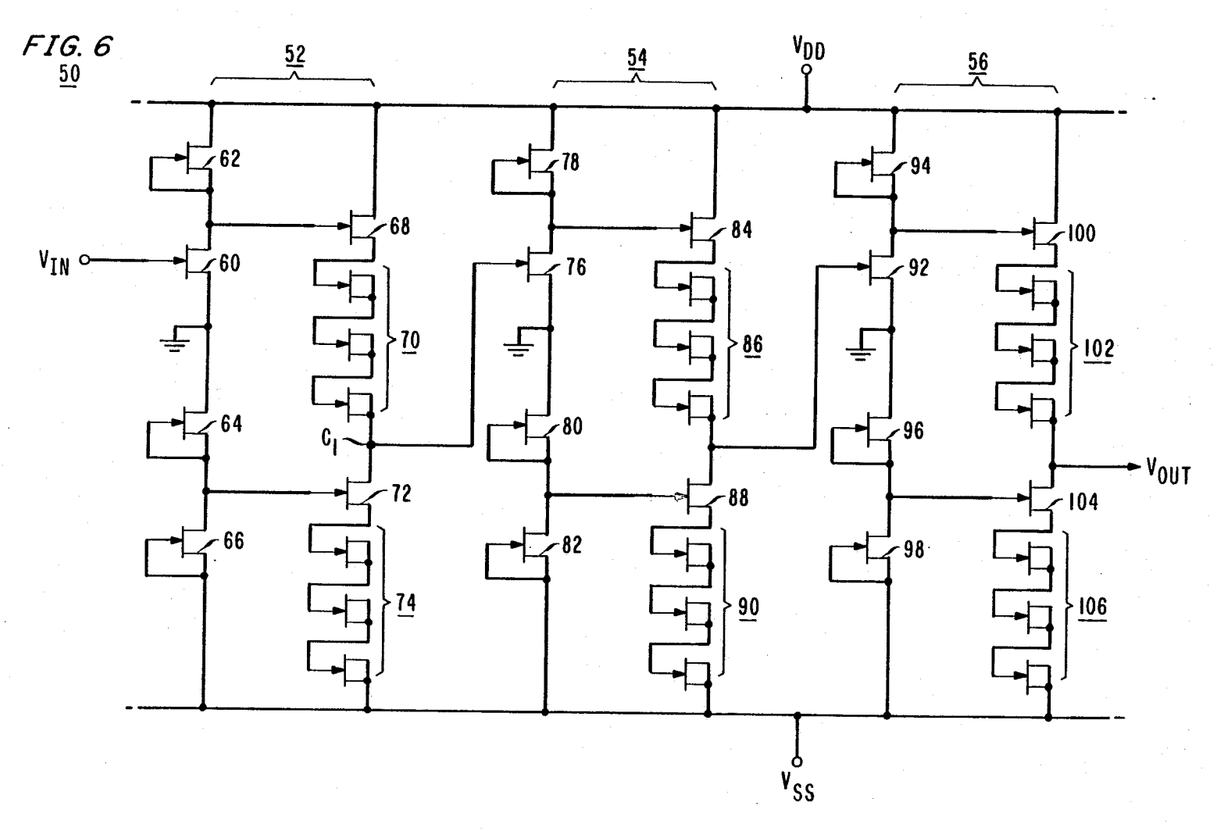
FIG. 6 illustrates an exemplary multistage symmetric amplifier formed in accordance with the present invention.

Referring to FIG. 6, a multistage symmetric amplifier 50 is shown which includes a first (or input) stage 52, a second stage 54, and a third (or output) stage 56. Each stage is identical in design to amplifier 30 of FIG. 3, where only the size of the various FETs used to form each stage may be altered to provide different impedance levels at each stage. In particular, first stage 52 includes an input FET 60 which is coupled at its gate to the input voltage signal $V_{IN}$. An active load FET 62 is coupled as shown between power supply VDD and the drain of FET 60. Impedance matching elements 64 and 66 are included in the input branch of first stage 52 between the source of input FET 60 and the second power supply VSS. As discussed above, elements 64 and 66 are sized to provide a gate bias to FET 72 which is substantially equal to the bias applied to buffer FET 68. In this particular arrangement, impedance matching elements 64 and 66 comprise active load elements, formed by a pair of gate-source coupled FETs, connected in series between the source of input FET 60 and VSS. As in FIG. 3, resistors may be substituted for these FETs.

As with amplifier 30 discussed above, the drain of input FET 60 is coupled to the gate of a first buffer FET 68, where the drain of first buffer FET 68 is directly coupled to VDD. A first diode level shifting arrangement 70 (illustrated in FIG. 6 as consisting of three source-drain coupled FETs) is connected between the source of first buffer FET 68 and the output of first stage 52 (denoted as $C_1$ in FIG. 6). The symmetry in first stage 52 is provided by a second buffer FET 72 and second diode level shifting arrangement 74 connected in series between output node $C_1$ and VSS. In order to preserve the symmetry, second buffer FET must be identical (in size) to buffer FET 68. Additionally, second diode level shifting arrangement 74 must comprise the same number of source-drain coupled FETs as first arrangement 70.

As shown in FIG. 6, the output from first stage 52 is directly connected to the input of second stage 54. That is, the drain of second buffer FET 72 is directly connected to the gate of input FET 76 of second stage 54. Second stage 54 further includes in its input branch an active load FET 78 and active load impedance matching elements 80,82 (illustrated as gate-source coupled FETs). The output branch of second stage 54 includes a first buffer FET 84 coupled at its gate to the drain of input FET 76, and a first diode level shifting arrangement 86 comprising a series of three source-drain coupled FETs. The symmetry is completed by a second buffer FET 88 and second diode level shifting arrangement 90, fabricated to match first buffer FET 84 and first diode arrangement 86, respectively. The output from second stage 54, denoted $C_2$ in FIG. 6, is then directly connected to the input of third stage 56, the gate of input FET 92. Third stage 56 comprises an active load FET 94, impedance matching FETs 96,98, first and second buffer FETs 100,104, and first and second diode level shifting arrangements 102,106, where all of these devices function as described above. The output from third stage 56 is thus the final amplified output signal $V_{OUT}$ from multistage amplifier 50, where the amount of gain imposed on signal $V_{OUT}$ will be a function of the gain provided by each stage.

It is to be understood that although the symmetrical amplifier design of the present invention was described as particularly advantageous when fabricated with InP-based FETs, various other materials, including but not limited to GaAs, may be utilized to form the symmetric amplifier arrangement of the present invention and enjoy the same benefits of threshold voltage and supply voltage insensitivity.

I claim:

1. A symmetric integrated FET amplifier comprising
   an input FET including a gate, source and drain, responsive to an applied input voltage signal;
   input load means coupled between the drain of said input FET and a first power supply source;
   first impedance matching means connected to the source of said input FET, said first impedance matching means comprising an impedance value essentially the impedance of said input load means;
   second impedance matching means connected between said first impedance matching means and a second power supply source, said second impedance matching means comprising an impedance value essentially the impedance of said input FET;
   a first buffer FET including a gate, source and drain, the gate being coupled to the drain of said input FET, the drain being coupled to said first power supply source;
   first voltage level shifting means coupled between the source of said first buffer FET and the amplifier output, said first voltage level shifting means for supplying a predetermined DC voltage drop to the signal appearing at the gate of said first buffer FET;
   a second buffer FET including a gate, source and drain, the gate being coupled to the connection between said first and second impedance matching means and the source being coupled to the first voltage level shifting means at the amplifier output, said second buffer FET being essentially identical in size to said first buffer FET; and
   second voltage level shifting means coupled between the drain of said second buffer FET and said second power supply source, said second voltage level shifting means for supplying said predetermined DC voltage to the signal appearing at the gate of said second buffer FET.

2. A symmetric integrated FET amplifier as defined by claim 1 wherein the input load means comprises a resistive element.

3. A symmetric integrated FET amplifier as defined by claim 1 wherein the input load means is an active load comprising an FET including gate, drain and source, the drain of the load FET coupled to the first power supply source, the gate and the source connected together and coupled to the drain of the input FET.

4. A symmetric integrated FET amplifier as defined by claim 1 wherein the first and second impedance matching means each comprise a resistor element.

5. A symmetric integrated FET amplifier as defined by claim 1 wherein
   the first impedance matching means comprises an FET including gate, drain and source, the drain of the first impedance matching FET coupled to the source of the input FET, the gate and the source connected together; and
   the second impedance matching means comprises an FET including gate, drain and source, the drain of the second impedance matching FET coupled to the connected gate and source of said first impedance matching FET, the gate and source of said second impedance matching FET connected together and coupled to the second power supply source.

6. A symmetric integrated FET amplifier as defined by claim 1 wherein the first and second voltage level shifting means each comprise a series connection of N diode elements ($N \geq 1$), each diode element capable of providing a specific voltage drop ($V_{diode}$).

7. A symmetric integrated FET amplifier as defined by claim 6 wherein the first and second voltage level shifting means each comprise a plurality of M diode elements ($M > 1$), wherein the predetermined DC voltage drop provided by said first and second voltage level shifting means will be essentially $M*V_{diode}$.

8. A symmetric integrated FET amplifier as defined by claims 6 or 7 wherein each diode element comprises a source-drain connected FET.

9. A multistage integrated FET amplifier comprising a plurality of N separate stages directly connected in series, each separate amplifier stage comprising
   an input FET including a gate, source and drain, responsive to an applied input voltage signal;
   input load means coupled between the drain of said input FET and a first power supply source;
   first impedance matching means connected to the source of said input FET, said first impedance matching means comprising an impedance value essentially the impedance of said input load means;
   second impedance matching means connected between said first impedance matching means and a second power supply source, said second impedance matching means comprising an impedance value essentially the impedance of said input FET;
   a first buffer FET including a gate, source and drain, the gate being coupled to the drain of said input FET, the drain being coupled to said first power supply source;
   first voltage level shifting means coupled between the source of said first buffer FET and the amplifier output, said first voltage level shifting means for supplying a predetermined DC voltage drop to the signal appearing at the gate of said first buffer FET;
   a second buffer FET including a gate, source and drain, the gate being coupled to the connection between said first and second impedance matching means and the source being coupled to the first voltage level shifting means at the amplifier output, said second buffer FET being essentially identical in size to said first buffer FET; and
   second voltage level shifting means coupled between the drain of said second buffer FET and said second power supply source, said second voltage level shifting means for supplying said predetermined DC voltage to the signal appearing at the gate of said second buffer FET.

10. A multistage integrated FET amplifier as defined by claim 9 wherein the input load means comprises a resistive element.

11. A multistage integrated FET amplifier as defined by claim 9 wherein the input load means is an active load comprising an FET including gate, drain and source, the drain of the load FET coupled to the first power supply source, the gate and the source connected together and coupled to the drain of the input FET.

12. A multistage integrated FET amplifier as defined by claim 9 wherein the first and second impedance matching means each comprise a resistor element.

13. A multistage integrated FET amplifier as defined by claim 9 wherein the first impedance matching means comprises an FET including gate, drain and source, the drain of the first impedance matching FET coupled to the source of the input FET, the gate and the source connected together; and the second impedance matching means comprises an FET including gate, drain and source, the drain of the second impedance matching FET coupled to the connected gate and source of said first impedance matching FET, the gate and source of said second impedance matching FET connected together and coupled to the second power supply source.

14. A multistage integrated FET amplifier as defined by claim 9 wherein the first and second voltage level shifting means each comprise a series connection of N diode elements ($N >= 1$), each diode element capable of providing a specific voltage drop ($V_{diode}$).

15. A multistage integrated FET amplifier as defined by claim 14 wherein the first and second voltage level shifting means each comprise a plurality of M diode elements ($M > 1$), wherein the predetermined DC voltage drop provided by said first and second voltage level shifting means will be essentially $M*V_{diode}$.

16. A multistage integrated FET amplifier as defined by claims 14 or 15 wherein each diode element comprises a source-drain connected FET.

* * * * *